US011135860B2

(12) United States Patent
Mima (10) Patent No.: US 11,135,860 B2
(45) Date of Patent: Oct. 5, 2021

(54) LIGHT IRRADIATION DEVICE AND PRINTING DEVICE (71) Applicant: KYOCERA Corporation, Kyoto (JP)

(72) Inventor: Takayuki Mima, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/769,130

(22) PCT Filed: Mar. 19, 2019

(86) PCT No.: PCT/JP2019/011432
§ 371 (c)(1),
(2) Date: Jun. 2, 2020

(87) PCT Pub. No.: WO2019/181937
PCT Pub. Date: Sep. 26, 2019

(65) Prior Publication Data
US 2021/0229476 A1 Jul. 29, 2021

(30) Foreign Application Priority Data
Mar. 22, 2018 (JP) .............................. JP2018-054174

(51) Int. Cl.
*B41J 29/377* (2006.01)
*B41J 11/00* (2006.01)
(52) U.S. Cl.
CPC ....... *B41J 29/377* (2013.01); *B41J 11/00214* (2021.01); *B41J 11/00216* (2021.01)

(58) Field of Classification Search
CPC .................. B41J 29/377; B41J 11/0021; B41J 11/00218; B41J 11/00214; B41J 11/00216
See application file for complete search history.

(56) References Cited

U.S. PATENT DOCUMENTS

2005/0253914 A1* 11/2005 Yokoyama ......... B41J 11/00218
347/102
2013/0221245 A1 8/2013 Till
(Continued)

FOREIGN PATENT DOCUMENTS

JP 2010-110938 A 5/2010
JP 3190306 U 4/2014
(Continued)

Primary Examiner — Matthew Luu
Assistant Examiner — Kendrick X Liu
(74) Attorney, Agent, or Firm — Volpe Koenig (57) ABSTRACT A light irradiation device according to the disclosure comprises: a light source comprising a plurality of light-emitting elements; a heat-dissipating member thermally connected to the light source; an air blower section capable of blowing air on the heat-dissipating member; a drive section which drives the light source; and a housing which receives therein the light source, the heat-dissipating member, the air blower section, and the drive section, the housing comprising a plurality of ventilating slots serving as inlets and outlets for outside air, a lower face provided with an irradiation opening for external irradiation of light from the light source, a side face which is vertically oriented, and an inclined face which is located on an upper side of the housing and is opposed to the lower face, and the inclined face is provided with at least one ventilating slot.

12 Claims, 4 Drawing Sheets (56) References Cited

U.S. PATENT DOCUMENTS

2014/0292921 A1* 10/2014 Tanaka ................... B41J 29/377
            347/34
2015/0112411 A1*  4/2015 Beckman ............. A61N 5/0616
            607/90

FOREIGN PATENT DOCUMENTS

| JP | 2014-184596 A | 10/2014 |
| JP | 3196411 U | 2/2015 |
| WO | 2012/149036 A1 | 11/2012 |

* cited by examiner

LIGHT IRRADIATION DEVICE AND PRINTING DEVICE

CROSS-REFERENCE TO RELATED APPLICATIONS

This application is a national stage entry according to 35 U.S.C. 371 of International Application No. PCT/JP2019/011432, filed on Mar. 19, 2019, which claims priority to Japanese Patent Application No. 2018-054174, filed on Mar. 22, 2018, the contents of which are entirely incorporated herein by reference.

FIELD

The present disclosure relates to a light irradiation device and a printing device incorporating the same.

BACKGROUND

Light irradiation devices, each comprising a housing, and a light source, e.g. a lamp for ultraviolet or infrared radiation or an LED (Light Emitting Diode) and a drive substrate for driving the light source received in the housing, find extensive application in various fields, including a medical field related to disinfection, etc., a manufacturing-assembly field related to the curing of an adhesive or an ultraviolet-curable resin in the process of mounting electronic components, etc., a drying treatment field related to efficient drying of an object under infrared irradiation, etc., and a printing field related to the drying or curing of printing ink.

Among such light irradiation devices, those that are used for printing purposes, in particular, are expected to emit irradiation light at even higher output level in keeping with the recent increase in printing speed, and also expected to be brought down in size for space savings.

In a light irradiation device in which heat is given off by a light source during irradiation of light, the amount of generated heat tends to increase with an increase in the quantity of light from the light source. In the interests of both device size reduction and efficient heat dissipation, a heat sink thermally connected to the light source is also placed in a housing of the device (refer to Japanese Utility Model Registration No. JP 3190306 U and Japanese Utility Model Registration No. JP 3196411 U).

SUMMARY

However, to place the light source and a drive section therefor, and in addition, for example, a fan and a heat-dissipating member such as the heat sink together in a single housing of the light irradiation device, the housing needs to be upsized, which makes device size reduction difficult.

This trend has created a demand for a light irradiation device that is compact, yet exhibits outstanding light irradiation performance, and is capable of efficient cooling of a light source even under conditions of increased heat generation due to an increase in light quantity.

A light irradiation device according to the disclosure comprises: a light source comprising a plurality of light-emitting elements; a heat-dissipating member thermally connected to the light source; an air blower section capable of blowing air on the heat-dissipating member; a drive section which drives the light source; and a housing which receives therein the light source, the heat-dissipating member, the air blower section, and the drive section, the housing comprising a plurality of ventilating slots serving as inlets and outlets for outside air, a lower face provided with an irradiation opening for external irradiation of light from the light source, a side face which is vertically oriented, and an inclined face which is located on an upper side of the housing and is opposed to the lower face, and the inclined face is provided with at least one ventilating slot of the plurality of ventilating slots.

A printing device according to the disclosure comprises: a printing section which carries out printing on a printing medium under conveyance; and the light irradiation device according to the disclosure applying light to the printing medium under conveyance following completion of printing.

In accordance with the light irradiation device according to the disclosure, the inclined face which is located on the upper side of the housing is provided with at least one of the ventilating slots that serve as inlets and outlets for outside air for cooling the light source which is located inside the housing and on a lower side of the housing. This makes it possible to increase the opening area of the ventilating slot while reducing the size of the housing, and thereby achieve efficient cooling of the light source. Thus, a compact light irradiation device of outstanding light irradiation performance can be provided.

The printing device according to the disclosure includes the light irradiation device according to the disclosure built as a compact light irradiation device of outstanding cooling performance, and can thus be reduced in size and yet increased in efficiency.

DETAILED DESCRIPTION

A light irradiation device and a printing device in accordance with embodiments of the disclosure will now be described with reference to drawings.

Figure 1:
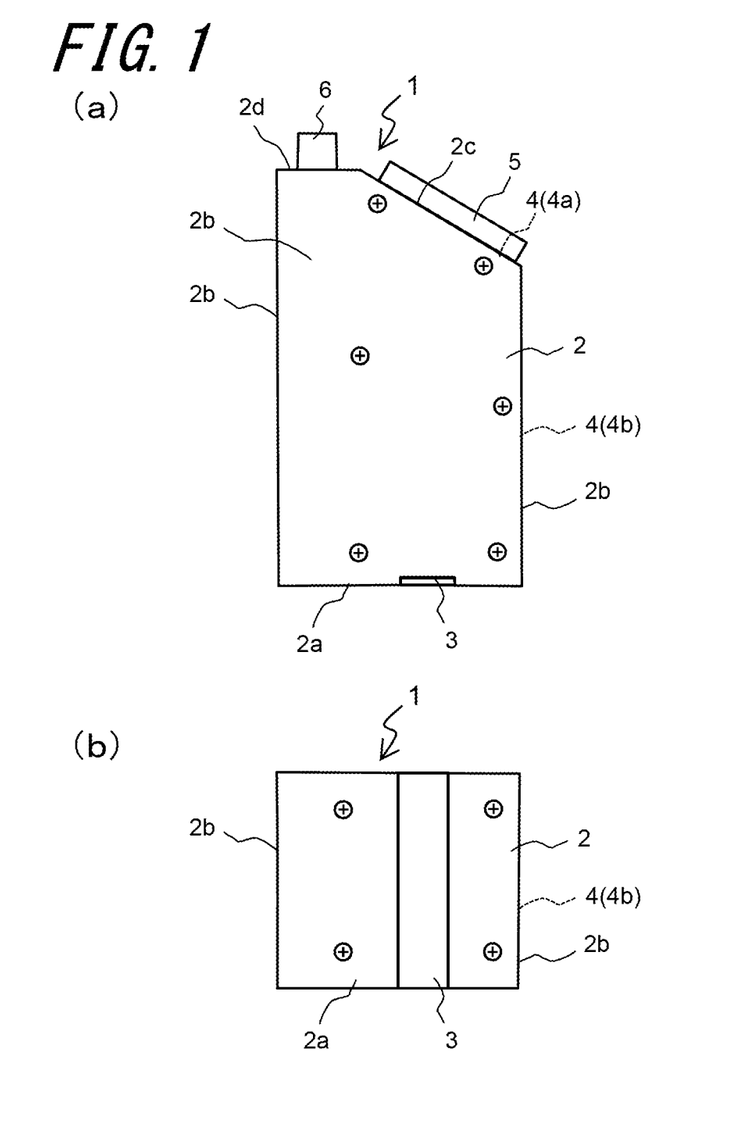
FIG. 1A is a front view showing the appearance of an embodiment of a light irradiation device according to the disclosure.
FIG. 1B is a bottom view of the light irradiation device.
Figure 2:
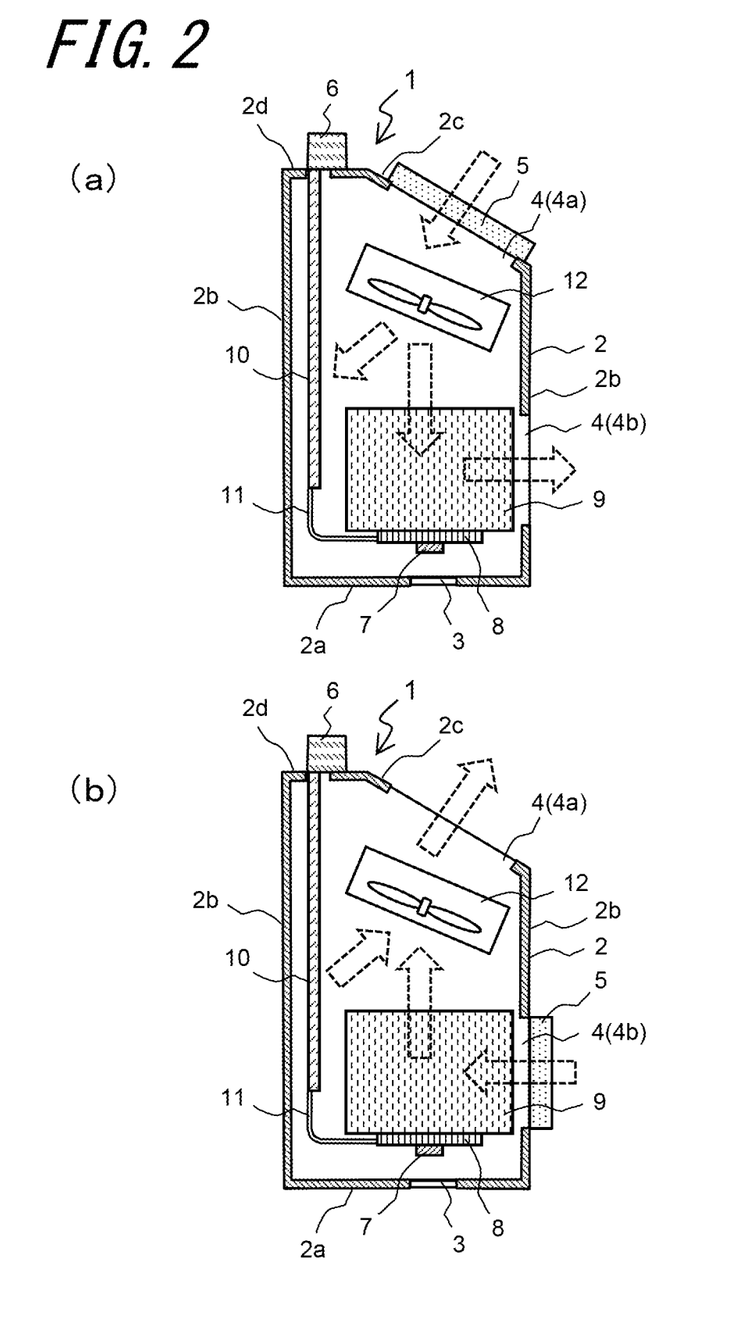
FIGS. 2A and 2B are sectional views each schematically showing the structure of an embodiment of the light irradiation device according to the disclosure.

FIGS. 1A and 1B are external views of an embodiment of a light irradiation device according to the disclosure, showing a front view in FIG. 1A and a bottom view in FIG. 1B. Moreover, FIGS. 2A and 2B are sectional views each schematically showing the structure of an embodiment of the light irradiation device according to the disclosure. In the following description, the terms of device orientation and disposition, e.g. "upper", "lower", "left", and "right" are used only for the sake of clarity in explanation, and are not intended to be limiting of the principle of operation of the light irradiation device and the printing device.

A light irradiation device 1 shown in FIGS. 1A to 2B is constructed by receiving, in a housing 2, a light source 7 including a plurality of light-emitting elements, a heat sink 9, provided as a heat-dissipating member, thermally connected to the light source 7, and a cooling fan 12 serving as an air blower section capable of blowing air on the heat sink 9. A drive substrate 10 serving as a drive section which drives the light source 7 is also disposed in the housing 2.

The housing 2, which constitutes the exterior of the light irradiation device 1, is made of a metal or a plastic, for example. In this embodiment, the housing 2 is substantially shaped in a rectangular prism including a lower face 2a provided with an irradiation opening 3 for external irradiation of light from the light source 7, a side face 2b which is vertically oriented, and an inclined face 2c which is located on an upper side of the housing 2 and is opposed to the lower face 2a. The inclined face 2c is provided with at least one ventilating slot 4 (4a). For the case of the housing 2 designed for downward emission of irradiation light from the light source 7 through the lower face 2a, for example, the housing 2 measures about 150 mm in vertical dimension, about 100 mm in horizontal dimension as seen in FIGS. 1A and 1B, and about 80 mm in depth dimension. The housing 2 may be of any given external shape suited to the intended use of the light irradiation device 1, for example, a cubic shape, a triangular prism shape, a circular cylindrical shape, or a semicircular column shape. The housing 2 includes the inclined face 2c on the upper side thereof regardless of external shape.

Moreover, the housing 2 may be of any given size suited to the intended use of the light irradiation device 1 without limitations to the dimensions as described above. For example, in applying the light irradiation device 1 to a printing device such as a line printing device including a print head which is nearly equal in width to a printing medium, a plurality of the light irradiation devices 1 may be arranged in an array of substantially the same width as that of the printing medium, or alternatively, the depth dimension of the light irradiation device 1 may be adjusted to an extent which is substantially equal to the width of the printing medium.

The housing 2 is provided with the irradiation opening 3 through the lower face 2a thereof to permit the exit of light from the light source 7 for application of the light to an object of light irradiation. While, in this embodiment, the irradiation opening 3 is configured to extend entirely across the lower face 2a of the housing 2 in a depth direction of the housing 2 as shown in FIG. 1B, the configuration of the irradiation opening 3 is not limited to this. Where the light irradiation object is a printing medium, when the conveyance direction of the printing medium is a horizontal direction as seen in the drawing, the irradiation opening 3 is suitable for light irradiation across the whole depth of the housing 2. The irradiation opening 3 may be of any given shape and size suited to the intended use of the light irradiation device 1.

Moreover, the irradiation opening 3 may be provided with a cover member made of a material which transmits light from the light source 7, e.g., glass or a heat-resistant plastic, as a member for covering the opening.

In the light irradiation device 1 according to the disclosure, the irradiation opening 3 is not opened in the central area, including the center point, of the lower face 2a of the housing 2, but is opened in a position offset from the center point of the lower face 2a so as to face the light source 7. Alternatively, the irradiation opening 3 may be located in a position including the center point of the lower face 2a, expressed differently, is opened at the midportion of the lower face 2a. The irradiation opening 3 may be formed in any given position and may be of any given shape and size suited to the intended use of the light irradiation device without specific limitations. That is, the irradiation opening 3 may be formed in any one of the midportion of the lower face 2a, a position intermediate the center point of the lower face 2a and an end of the lower face 2a, and a position near an end of the lower face 2a. Moreover, the irradiation opening 3 may be of any one of a rectangular shape as shown in FIG. 1B, an oblong shape, and a circular shape. Furthermore, instead of a single irradiation opening 3, an arrangement of a plurality of irradiation openings 3 may be adopted.

The housing 2 is provided with a plurality of ventilating slots 4 (4a and 4b), which serve as inlets and outlets for outside air, positioned in faces located above the lower face 2a, for example, at least one of the side faces 2b, the inclined face 2c, and a top face 2d. In this embodiment, the inclined face 2c located above the lower face 2a is provided with the ventilating slot 4a, and the side face 2b located likewise above the lower face 2a is provided with the ventilating slot 4b. At least one of the ventilating slots 4a and 4b, or each of the ventilating slots 4a and 4b as in this embodiment, is offset with respect to the center of the housing 2, and more specifically, the slot lies in a part of the corresponding face displaced from the center axis of the housing 2.

Thus, when at least one of the ventilating slots 4a and 4b opened in the housing 2 at a position displaced from the center point of the corresponding face located above the irradiation opening 3, it is possible to define the flow of outside air which comes in and goes out through the ventilating slots 4a and 4b to efficiently cool the light source 7 which faces the irradiation opening 3 opened at a position displaced from the center point of the lower face 2a, according to the arrangement of the light source 7. This is advantageous in making the light irradiation device 1 compact and in carrying out cooling against heat given off by the light source 7.

Moreover, the light irradiation device 1 includes, in the housing 2, the heat-dissipating member (heat sink) 9 which is located above the light source 7, that is, located opposite to the irradiation opening 3, and is thermally connected to the light source 7. In the embodiment shown in FIGS. 2A and 2B, the heat-dissipating member 9 is disposed above the light source 7 in a state of being thermally connected to the light source 7 via a light-source mounting substrate 8 on which the light source 7 is mounted.

In the light irradiation device 1, it is preferable that the heat-dissipating member 9 is located above the light source 7, that at least one of the ventilating slots 4, or the ventilating slot 4b as in this embodiment, is located on a lateral side of the heat-dissipating member 9 in the side face 2b, and that the air blower section (cooling fan) 12 is located between the heat-dissipating member 9 and the ventilating slot 4a of the inclined face 2c. This makes it possible to define the flow of outside air so as to efficiently cool the heat-dissipating member 9 by the air blower section 12 between the ventilating slot 4a of the inclined face 2c and the ventilating slot 4b located on the lateral side of the heat-dissipating member 9.

Thus, the light irradiation device 1 is preferably so designed that the irradiation opening 3 is opened at a position displaced from the center point of the lower face 2a of the housing 2 and so as to face the light source 7, and the ventilating slot 4a, 4b is opened at a position displaced from the center of the corresponding face located above the lower face 2a of the housing 2. In this case, for example, placing the cooling fan 12 below the ventilating slot 4a of the inclined face 2c makes it possible to define such an outside air-flow path as shown in FIG. 2A that outside air which comes in through the ventilating slot 4a of the inclined face 2c, is introduced into the heat-dissipating member 9 positioned corresponding to the light source 7, and then discharged out of the ventilating slot 4b of the side face 2b. Moreover, operating the cooling fan 12 in a manner to allow the flow of outside air to reverse in direction makes it possible to define such an outside air-flow path as shown in FIG. 2B that outside air which comes in through the ventilating slot 4b disposed in a part of the side face 2b of the housing 2 close to the heat-dissipating member 9, is passed through the heat-dissipating member 9, and then discharged out of the ventilating slot 4a of the inclined face 2c. Even if the irradiation opening 3 is opened at the center of the lower face 2, it is possible to define outside air-flow paths which can efficiently cool the heat-dissipating member 9 in a similar way.

Thus, in accordance with the arrangement of the light source 7, the heat-dissipating member 9 can be positioned close to the ventilating slot 4b in the flow of outside air within the housing 2. This is advantageous in efficiently cooling the light source 7, and in making the light irradiation device 1 compact. Moreover, providing the ventilating slot 4a in the inclined face 2c makes it possible to attain a relatively large opening area even if it is desired to reduce the size of the housing 2, and thereby efficiently cool the light source 7. Note that dashed arrows shown in FIGS. 2A and 2B indicate directions of flows of outside air in the light irradiation device 1.

The heat-dissipating member 9 is made of a highly heat-conductive metal such as aluminum or copper. As the heat-dissipating member 9, for example, it is possible to use a rectangular prism-shaped block of a metal such as aluminum or copper provided with many grooves obtained by cutting work for an increase in surface area (other-than-groove uncut part serves as a fin) or a flat plate of a metal such as aluminum or copper with many aluminum- or copper-made sheets, each serving as a fin, to permit the passage of outside air between the fins.

Thermal grease or the like may be interposed between the heat-dissipating member 9 and the light-source mounting substrate to enhance adhesion between them for improvement in the condition of thermal connection between the heat-dissipating member 9 and the light-source mounting substrate 8. This makes it possible to increase the efficiency of heat dissipation for the light source 7.

The light source 7 is disposed in the housing 2 so as to face the irradiation opening 3 opened in the lower face 2a. As the light source 7, for example, it is possible to use a matrix of a plurality of LEDs (Light Emitting Diodes) placed on the light-source mounting substrate 8 for the installation of the light source 7. For example, a GaN LED may be used as an ultraviolet LED for the light source 7. Moreover, for example, a GaAs LED may be used as an infrared LED for the light source 7. That is, the device used for the light source 7 can be appropriately selected according to the wavelength in use. For example, a plate-like ceramic wiring substrate may be used for the light-source mounting substrate 8. The ceramic wiring substrate is suitable as the light-source mounting substrate 8 for the light source 7 in which heat-generating LEDs are integrated because the ceramic which is the base material of the ceramic wiring substrate has heat resistance.

Moreover, the light irradiation device 1 includes the drive section (drive substrate) 10 which is disposed in the housing 2 so as to be electrically connected to the light source and drives the light source 7. The drive substrate 10 is provided with a drive circuit to supply electric power to the light source 7 for light emission control. The drive substrate 10 may be designed to drive the cooling fan 12, as well as to control the rotating speed of the cooling fan 12 in accordance with the condition of generation of heat from the light source 7. Moreover, a heat-dissipating member such as a heat sink for dissipation of heat from an electronic component which is apt to acquire a high temperature in particular, e.g. a power transistor, may be attached to the drive substrate 10. Furthermore, the inner surface of the housing 2 may be provided with, for example, a groove, a fin, or a baffle plate, for causing the flow of outside air to impinge effectively upon a part of the drive substrate 10 which is apt to acquire a high temperature.

Moreover, in the light irradiation device 1, it is preferable that the heat-dissipating member 9 and the air blower section 12 are located below the inclined face 2c, and that the drive section (drive substrate) 10 is located on a higher side of the inclined face 2c. In this embodiment, the drive substrate 10 is located below the top face 2d continuing to the higher side of the inclined face 2c. In this case, even if the drive substrate 10 is relatively long, the housing 2 may be reduced in size and is yet capable of receiving the drive substrate 10 therein. In the light irradiation device 1 according to this embodiment, as shown in FIGS. 2A and 2B, the drive substrate 10 is arranged along a side wall of the housing 2. It is desirable to arrange the drive substrate 10 along a side wall of the housing 2 in the interest of permitting transmission of heat from the drive substrate 10 to the side wall of the housing 2 and dissipation of the heat out of the side face 2b.

The drive substrate 10 received in the housing 2 generates heat on actuation of the light source 7, and thus needs be cooled properly. In the light irradiation device 1 according to this embodiment, the drive substrate 10 received in the housing 2 is located close to the ventilating slot 4a disposed above away from the light source 7. This positioning allows the drive substrate 10 to be exposed to outside air flowing within the housing 2, and thus be efficiently cooled.

Moreover, in the light irradiation device 1, the ventilating slot 4b, which is located on the lateral side of the heat-dissipating member 9, is preferably formed in one side face 2b continuing to a lower side of the inclined face 2c. This makes it possible to efficiently secure the flow of outside air on the inclined side of the inclined face 2c, and to secure a wide area of the other opposed side face 2b. Consequently, the light irradiation device 1 can be mounted and positioned with ease when incorporated in, for example, a printing device.

In FIGS. 1A to 2B, reference numeral 5 denotes a filter disposed at the ventilating slot 4a or the ventilating slot 4b. For the case shown in FIG. 2A, the ventilating slot 4b is free of the filter, whereas, for the case shown in FIG. 2B, the ventilating slot 4a is free of the filter. As a matter of course, in addition to the ventilating slots 4a and 4b, any other ventilating slot (not shown) may be provided with the filter 5.

For example, a sponge or nonwoven cloth may be used for the filter 5. The filter 5 can prevent the entry of foreign matter, such as dust and dirt in outside air, into the housing 2 to avoid a decrease in the efficiency of heat dissipation from the light source 7 or the drive substrate 10 due to the accumulation of dust and dirt on the heat-dissipating member 9 or the drive substrate 10. This makes it possible to improve the reliability of the light irradiation device 1. Moreover, the placement of the filter 5 allows outside air to flow around the ventilating slot 4 at a more moderate pace, and also permits absorption of operating noise from the cooling fan 12 received in the housing 2, thus reducing the cooling-fan 12 noise emanating from the light irradiation device 1.

The air blower section (cooling fan) 12 received in the housing 2 is intended to create paths for the flow of outside air (air) from an inlet corresponding to one of a plurality of ventilating slots 4 to an outlet corresponding to the other ventilating slot 4. An axial fan is typically adopted to obtain such a cooling fan as is compact and yet supplies a large quantity of air. A fan of different type may be used instead.

In the light irradiation device 1, preferably, as shown in FIGS. 2A and 2B, the cooling fan 12 is inclined in the same direction as the direction in which the inclined face 2c is inclined. This makes it possible to efficiently blow air by the cooling fan 12 on a part of the heat-dissipating member 9 located away from the ventilating slot 4a of the inclined face 2c. Moreover, pressure losses under the flow of air can be reduced at the ventilating slot 4a by inclining the cooling fan 12 in the same direction as the direction of inclination of the opening of the ventilating slot 4a.

The inclination of the cooling fan 12 does not necessarily have to be the same as the inclination of the ventilating slot 4a so as to be parallel to each other, or may be different in angle from the inclination of the ventilating slot 4a, or they may be parallel to each other. Moreover, the cooling fan 12 may be spaced away from the ventilating slot 4a and the heat-dissipating member 9, or may be placed in the proximity of or in contact with any one of the ventilating slot 4a and the heat-dissipating member 9.

In FIGS. 1A to 2B, reference numeral 6 denotes a connector, which is connected to the drive substrate 10, led out of the housing 2. The supply of power to the drive substrate 10 from the exterior thereof, as well as the communications of control signals between the drive substrate 10 and the exterior thereof, is carried out via the connector 6. Moreover, the drive substrate 10 is electrically connected to the light source 7 through the light-source mounting substrate 8 by a cable 11. Six circled crisscrosses shown in the front view and four circled crisscrosses shown in the bottom view each indicate a screw used for the assembly of the housing 2. The screws are suitably placed according to the design of the housing 2.

Moreover, in the light irradiation device 1, preferably, as shown in FIGS. 1A to 2B, the housing 2 includes the inclined face 2c with the ventilating slot 4a on the upper side thereof, and also includes another ventilating slot 4b located on the lateral side of the heat-dissipating member 9 in the side face 2b. In this embodiment, the upper side inclined face 2c and the top face 2d constitute the upper surface of the housing 2, and the inclined face 2c is located on a side of the housing 2 corresponding to a side on which the irradiation opening 3 of the lower face 2a is located. While the upper side inclined face 2c and the irradiation opening 3 of the lower face 2a are located on the same side of the housing 2 in this construction, the upper side inclined face 2c and the irradiation opening 3 may be located on the opposite sides of the housing 2, respectively. Placing such an inclined face 2c on the upper side of the housing 2 makes it possible to impart a relatively large area to the ventilating slot 4a in the inclined face 2c even if there is a constraint to reduce the height dimension when installing the light irradiation device 1, and thereby allow outside air to efficiently come in and out of the housing 2. The placement also facilitates the positioning of the heat-dissipating member 9 in a location where it can be exposed to outside air flowing between the ventilating slot 4a of the inclined face 2c and the ventilating slot 4b located on the lateral side of the heat-dissipating member 9, and it is thus possible to efficiently cool the light source 7 via the heat-dissipating member 9.

Figure 3:
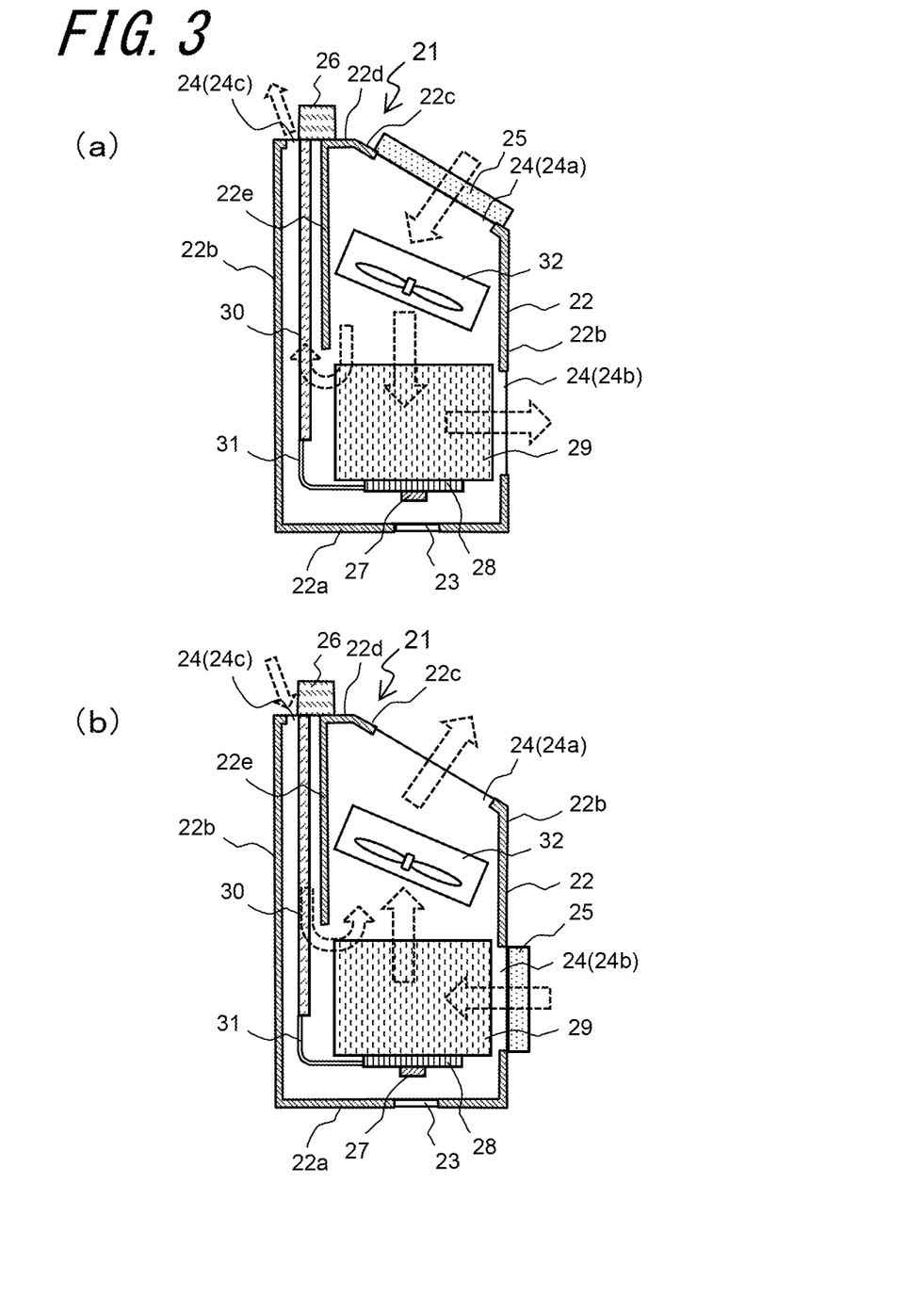
FIGS. 3A and 3B are sectional views each schematically showing the structure of another embodiment of the light irradiation device according to the disclosure.

FIGS. 3A and 3B are sectional views each schematically showing the structure of another embodiment of the light irradiation device according to the disclosure. In a light irradiation device 21 according to this embodiment, as shown in FIGS. 3A and 3B, preferably, a housing 22 includes, on an upper side thereof, a horizontally oriented top face 22d which and continues to an inclined face 22c and is provided with a ventilating slot 24c, and internally includes a partition portion 22e which separates a space communicating with a ventilating slot 24a of the inclined face 22c and a space communicating with the ventilating slot 24c of the top face 22d while keeping ventilation therebetween. In this embodiment, an upper part of the interior space of the housing 22 is divided by the partition portion 22e into a left-hand space and a right-hand space as seen in the drawings. The partition portion 22e is constructed of a plate-like member which is bent from the top face 22d of the housing 2 toward a lower face 22a of the housing, and then extends to a point near a heat sink 29. Although the depth dimension of the partition portion 22e is not illustrated in FIGS. 3A and 3B, it is desirable to form the partition portion 22e so as to extend across the whole depth of the housing 2 in the interest of dividing the upper part of the interior space of the housing into the left-hand space and the right-hand space.

In FIGS. 3A and 3B, reference numeral 23 denotes an irradiation opening, reference numeral 24b denotes a ventilating slot provided in a side face 22b, reference numeral 25 denotes a filter, reference numeral 26 denotes a connector, reference numeral 27 denotes a light source, reference numeral 28 denotes a light-source mounting substrate, reference numeral 29 denotes a heat-dissipating member, reference numeral 30 denotes a drive substrate, reference numeral 31 denotes a cable, and reference numeral 32 denotes a cooling fan. Each of the constituent components is similar to the corresponding one of those provided in the construction shown in FIGS. 1A to 2B.

As practiced in this embodiment, the housing 22 includes, on the upper side thereof, the top face 22d which continues to the inclined face 22c and is provided with the ventilating slot 24c, and internally includes the partition portion 22e which separates the space communicating with the ventilating slot 24a of the inclined face 22c and the space communicating with the ventilating slot 24c of the top face 22d while keeping ventilation therebetween. This makes it possible to define the flow of outside air toward the bottom of the inside of the housing 2 via the partition portion 22e between the ventilating slot 24a of the upper side inclined face 22c and the ventilating slot 24c of the top face 22d, and efficiently cool the interior of the housing. Moreover, as shown in FIG. 3A, the flow of outside air, coming in through the ventilating slot 24a of the inclined face 22c, may be partly caused to turn at the partition portion 22e, so that part of outside air can be discharged out of the ventilating slot 24c of the top face 22d. On the other hand, as shown in FIG. 3B, the flow of outside air, coming in through the ventilating slot 24c of the top face 22d, may be caused to turn at the partition portion 22e, so that part of outside air can be discharged out of the ventilating slot 24a of the inclined face 22c. This makes it possible to efficiently cool the interior of the housing 2, and reduce the influence of the flow of outside air toward the lower face 22a provided with the irradiation opening 3 on a region near the irradiation opening 23 and the light source 27. Moreover, it is possible to efficiently cool each of the light source 27 and the drive substrate 30 by the flow of outside air within the housing 2 while suppressing thermal influence between the light source 27 and the drive substrate 30.

While, in this embodiment, the upper side inclined face 22c and the top face 22d constitute the upper surface of the housing 2, the upper side of the housing 2 may additionally include a stepped face or a face inclined at different angle from the angle of inclination of the inclined face 22c. Moreover, the top face 22d does not necessarily have to be horizontally oriented in parallel to the lower face 22a, and may thus be slightly inclined or curved alternatively. While each of the inclined face 22c and the top face 22d may be of any given size suited to the specifications of the light irradiation device 21, as a general rule, the inclined face 22c is made larger than the top face 22d in the interest of increasing the efficiency of cooling the interior of the housing 2.

Moreover, in the light irradiation device 21, as shown in FIGS. 3A and 3B, the light source 27 and the drive substrate 30 are preferably located on the opposite sides, respectively, of the partition portion 22e within the housing 2. In this case, the light source 27 is preferably located closer to the upper side inclined face 22c than the partition portion 22e. It is possible to efficiently cool each of the thus arranged light source 27 and drive substrate 30 by the flow of outside air within the housing 2 while suppressing thermal influence between the light source 27 and the drive substrate 30.

Figure 4:
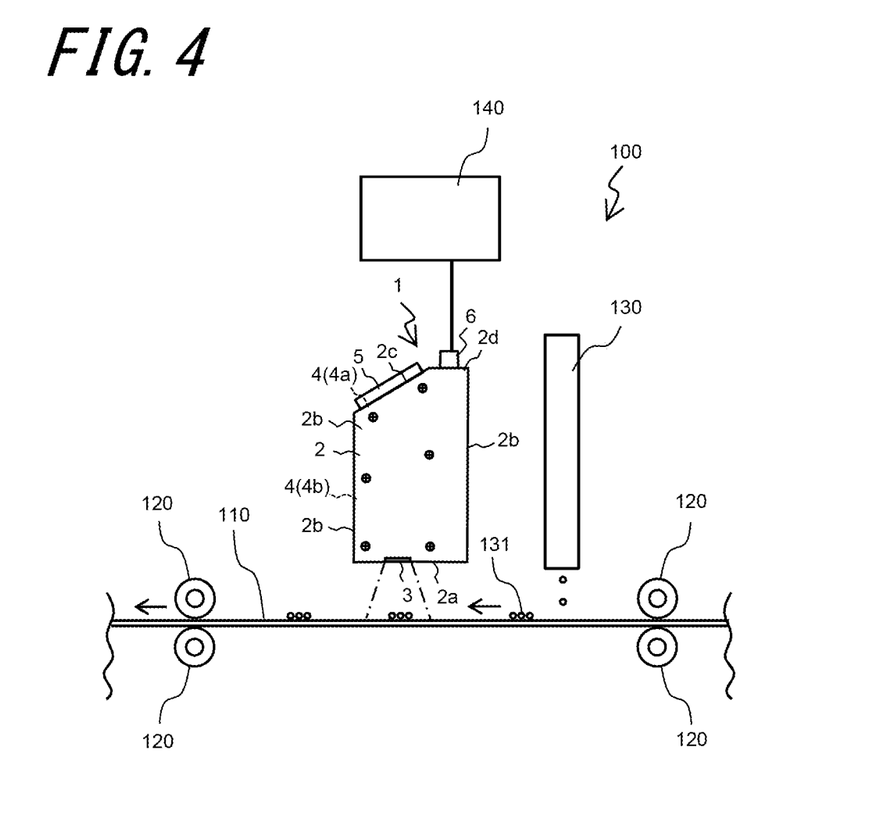
FIG. 4 is a front view schematically showing the structure of an embodiment of a printing device according to the disclosure.

FIG. 4 is a front view schematically showing the structure of an embodiment of a printing device according to the disclosure. As shown in FIG. 4, a printing device 100 according to this embodiment comprises a printing section 130 which carries out printing on a printing medium 110 which is being conveyed by a conveying section 120, and the light irradiation device 1 which applies light to the printing medium 110 under conveyance following the completion of the printing, wherein the irradiation opening 3 of the light irradiation device 1 is located on a far side of the light irradiation device 1 farther away from the printing section 130 in the conveyance direction of the printing medium 110. In the printing device 100 thus constructed, the printing medium 110, as well as ink 131 printed on the printing medium 110, can be irradiated with light while suppressing influence of light irradiation by the light irradiation device 1 on the printing section 130.

In the printing device 100 according to this embodiment, with use of an IJ (Ink Jet) head using ultraviolet-curable ink for the printing section 130, irradiation light from the light irradiation device 1 can be inhibited from reaching the printing section 130, and it is thus possible to reduce the occurrence of nozzle clogging in the IJ head serving as the printing section 130.

In this construction, as shown in FIG. 4, the inclined face 2c of the light irradiation device 1 preferably faces a downstream side of the conveyance direction of the printing medium 110. This arrangement, in addition to being advantageous in making the printing device 100 compact, makes it possible to reduce the influence of intake and exhaust through the ventilating slots 4 (4a and 4b) of the light irradiation device 1 on the discharge port of the IJ head, and effectively reduce the influence exerted on the accuracy of adhesion of the ink 131 to the printing medium 110.

Moreover, in the printing device 100 according to this embodiment, contrary to the case shown in FIG. 4, the inclined face 2c of the light irradiation device 1 may face an upstream side of the conveyance direction of the printing medium 110. This makes it possible to bring the irradiation section closer to the discharge port of the IJ head, and thereby shorten the time taken to complete the curing of the adherent ink 131, thus reducing the spreading of the ink 131. Moreover, in this case, as well as in the case where the inclined face 2c faces the downstream side of the conveyance direction of the printing medium 110, the ventilating slot 4b, which is located on a lateral side of the heat sink 9 of the light irradiation device 1, is preferably formed in the side face 2b opposite to the inclined face 2c (i.e. the side face continuing to the top face 2d). In this case, the ventilating slot 4a and the ventilating slot 4b lie at the opposite sides, respectively, of the housing 2. This makes it possible to effectively prevent the flow of air discharged out of the light irradiation device 1 from being supplied again in circulation to the light irradiation device 1 in intake and exhaust of the light irradiation device 1, and keep the light source 7 in a cooled condition with efficiency.

The printing device according to the disclosure, while comprising, like the printing device 100 exemplified in FIG. 4, a printing section 130 which carries out printing on a printing medium 110 which is being conveyed by a conveying section 120 and the light irradiation device 1 according to the disclosure which applies light to the printing medium 110 under conveyance following the completion of the printing, may be so designed that the irradiation opening 3 of the light irradiation device 1 is located on a near side of the light irradiation device 1 closer to the printing section 130 in the conveyance direction of the printing medium 110. In the printing device thus constructed, even if the distance between the printing section 130 and the light irradiation device 1 is increased with consequent increase in printing device size, the printing medium 110 which has undergone printing, and more specifically, the ink 131 printed on the printing medium 110, can be irradiated with light swiftly. This makes it possible to shorten time of light application to the printing medium 110 following the completion of printing even if the light irradiation device 100 increases in size for ever-greater irradiation light output, and reduce variations in ink leveling. Consequently, the printing device maintains high level of printing quality.

As a matter of course, the light irradiation device 21 shown in FIGS. 3A and 3B may be adopted in place of the light irradiation device 1 in the printing device 100 exemplified in FIG. 4, and also, the irradiation opening 3 (23) of the light irradiation device 1 (21) may be located at the center of the lower face 2a (22a).

For example, where the light irradiation device 1 (21) is incorporated in the printing device 100 such as a line printer, in the printing device 100 according to this embodiment, the depth dimension of the light irradiation device may be increased in conformity with the width of the printing medium 110, as seen in the drawing. In this case, when using an axial fan for the cooling fan 12 (32), a plurality of the cooling fans 12 (32) may be arranged depthwise on a single heat-dissipating member 9 (29). For the case of the heat-dissipating member 9 (29) having many cooling fins, the cooling fins are preferably formed perpendicularly with respect to the drive substrate 10 (30) to avoid interference with outside air flowing between the drive substrate 10 (30) and the heat-dissipating member 9 (29).

The printing section 130 carries out printing in such a manner that ink made for example of a photosensitive material can be printed in a predetermined pattern on the printing medium 110 which is being conveyed by the conveying section 120. The printing section 130, which may be constructed of an IJ head, is designed to direct a discharge of droplets containing the photosensitive material toward the printing medium 110, so that the ink 131 can be adherently printed on the printing medium 110. In this embodiment, for example, ultraviolet-curable ink is used as the photosensitive material. As the photosensitive material, in addition to the ultraviolet-curable ink, for example, a photoresist or a photocurable resin can be used.

In this embodiment, a line-type IJ head is adopted for use as the printing section 130. The IJ head 130 is provided with a plurality of linearly aligned ink discharge holes, through which, for example, ultraviolet-curable ink is discharged. The IJ head serving as the printing section 130 carries out printing on the printing medium 110 by directing the ink 131 discharged through the discharge holes toward the printing medium 110 which is being conveyed in a direction perpendicular to the depthwise alignment of the discharge holes, so that the ink 131 can be adherently printed on the printing medium 110.

While, in this embodiment, a line-type IJ head exemplifies the printing section 130, the printing section 130 is not limited to this. For example, a serial-type IJ head may be adopted instead. In another alternative, the printing section 130 may be constructed of an electrostatic head that causes a developer (toner) to adhere to the static electricity-laden printing medium 110 under the electrostatic force of the build-up of static electricity. Moreover, it is possible to use a liquid development device in which the printing medium 110 is immersed in a liquid developer for adhesion of the toner onto the printing medium 110. Furthermore, the printing section 130 may include developer (toner) conveying means constructed of Japanese hake (brush), a brush, or a roller, for example.

In the printing device 100, the light irradiation device 1 (21) has a function of curing the photocurable ink 131 printed on the printing medium 110 under conveyance via the conveying section 120, or exposing the ink 131 made of a photosensitive material to light. The light irradiation device 1 (21) is located on a downstream side of the printing section 130 in the direction of conveyance of the printing medium 110.

A control section 140 connected to the light irradiation device 1 (21) is electrically connected via the connector 6 (26) to the drive section (drive substrate) 10 (30), and has a function of controlling emission of light from the light source 7 (27) of the light irradiation device 1 (21). The control section 140 includes a memory thereinside, and the memory stores, for example, information representing characteristics of light that allows the photocurable ink 131 discharged from the IJ head serving as the printing section 130 to be cured in a relatively good condition.

Specific examples of the information stored in the memory include numerical values representing light emission intensity (emission intensity of light in each wavelength range) and wavelength distribution characteristics suited to the curing of a discharge of the ink 131 in droplet form. Since the printing device 100 according to this embodiment includes the control section 140, it is also possible to adjust the magnitude of drive current which is inputted to a plurality of light-emitting elements constituting the light source 7 (27) on the basis of the information stored in the control section 140. Thus, the printing device 100 achieves application of light of adequate quantity in conformity with the characteristics of ink in use by the operation of the light irradiation device 1 (21), and the ink 131 can be cured with light of relatively low energy.

In the printing device 100, the conveying section 120 conveys the printing medium 110 in a conveyance direction which is from right to left as seen in the drawing. The printing section 130 directs a discharge of the ink 131, which is ultraviolet-curable ink for example, toward the printing medium 110 under conveyance, so that the ink 131 can adhere to the surface of the printing medium 110. At this time, the ultraviolet-curable ink 131, which adheres to the printing medium 110 in a predetermined pattern, may be caused to adhere to either the entire surface or part of the surface of the printing medium 110. In the printing device 100, the ultraviolet-curable ink 131 printed on the printing medium 110 is cured under irradiation of light from the light irradiation device 1 (21).

The printing device 100 according to this embodiment benefits from the advantageous effects attained by the light irradiation device 1 (21). In the printing device 100 according to this embodiment, within the housing 2 (22) constituting the light irradiation device 1 (21), the heat-dissipating member 9 (29) and the drive substrate 10 (30) are disposed so as to overlap with each other in a direction perpendicular to the direction of exit of irradiation light from the light source 7 (27). This positioning allows the housing 2 (22) to have a reduced height. In this way, with the incorporation of the reduced-height light irradiation device 1 (21), the printing device 100 can be made compact.

In the printing device 100 according to this embodiment, the ultraviolet-curable ink 131 is used, and the light irradiation device 1 (21) carries out ultraviolet irradiation. As an alternative to this design, for example, the printing device may be so designed that water-based or oil-based ink 131 ejected from the IJ head serving as the printing section 130 is printed on the printing medium 110, and the ink 131 is dried and fixed in place under heat produced by infrared irradiation from the light irradiation device 1 (21). Such a printing device 100 capable of fixing the ink 131 to the printing medium 110 by infrared irradiation is not limited to an ink-jet printing device, but is applicable to other printing devices employing different printing method.

While, in this embodiment, the printing device 100 including the printing section 130 constructed of an IJ head exemplifies a printing device which incorporates the light irradiation device 1 (21) thereinto, the light irradiation device (21) is applicable to a variety of resin curing devices, including a photocurable resin-curing device capable of curing, for example, a paste of a resist used as ink printed on the surface of an object by means of spin-coating or screen printing. Moreover, the light irradiation device 1 (21) is also applicable to an irradiation light source of an exposure device for exposing, for example, a resist to light.

Although the disclosure has been detailed herein, it is to be understood that the disclosure is not limited to the above-described embodiments, and hence many changes and modifications may be made therein without departing from the scope of the disclosure.

REFERENCE SIGNS LIST 1, 21: Light irradiation device
2, 22: Housing
2a, 22a: Lower face
2b, 22b: Side face
2c, 22c: Inclined face
2d, 22d: Top face
22e: Partition portion
3, 23: Irradiation opening
(4a, 4b), 24 (24a, 24b, 24c): Ventilating slot
5, 25: Filter
6, 26: Connector
7, 27: Light source
9, 29: Heat-dissipating member (Heat sink)

10, 30: Drive section (Drive substrate)
12, 32: air blower section (Cooling fan)
100: Printing device
110: Printing medium
120: Conveyance section
130: Printing section (Ink jet head)
131: Ink
140: Control section

The invention claimed is:

1. A light irradiation device, comprising:
a light source comprising a plurality of light-emitting elements;
a heat-dissipating member thermally connected to the light source;
an air blower section capable of blowing air on the heat-dissipating member;
a drive section which drives the light source; and
a housing which receives therein the light source, the heat-dissipating member, the air blower section, and the drive section, the housing comprising a plurality of ventilating slots serving as inlets and outlets for outside air, a lower face provided with an irradiation opening for external irradiation of light from the light source, a side face which is vertically oriented, an inclined face which is located on an upper side of the housing and is opposed to the lower face, and a top face serving as a horizontal face, the top face continuing to a higher side of the inclined face;
wherein the drive section is located below the top face and along the side face of the housing, and
the inclined face is provided with at least one ventilating slot of the plurality of ventilating slots.

2. The light irradiation device according to claim 1, wherein
the heat-dissipating member is located above the light source,
at least one other ventilating slot of the plurality of ventilating slots is located in the side face and on a lateral side of the heat-dissipating member, and
the air blower section is located between the heat-dissipating member and the at least one other ventilating slot of the inclined face.

3. The light irradiation device according to claim 2, wherein
the air blower section is inclined in a same direction as a direction in which the inclined face is inclined.

4. The light irradiation device according to claim 1, wherein
the heat-dissipating member and the air blower section are located below the inclined face.

5. The light irradiation device according to claim 1, wherein
at least one other ventilating slot located on the lateral side of the heat-dissipating member is located in the side face on a lower side of the inclined face.

6. A printing device, comprising:
a printing section which carries out printing on a printing medium under conveyance; and
the light irradiation device according to claim 1, the light irradiation device applying light to the printing medium under conveyance following completion of printing.

7. The light irradiation device according to claim 1 wherein
the heat-dissipating member and the drive section are located so as to overlap with each other in a direction perpendicular to a direction of exit of irradiation light from the light source.

8. The light irradiation device according to claim 1, further comprising a connector which is located on an outer side of the top face and is connected to the drive section.

9. The light irradiation device according to claim 1, wherein
at least one other ventilating slot of the plurality of ventilating slots is provided in the top face of the housing.

10. The light irradiation device according to claim 9, wherein
the housing comprises therein a partition portion which separates a space communicating with the at least one ventilating slot of the inclined face and a space communicating with the at least one other ventilating slot of the top face while keeping ventilation therebetween.

11. The light irradiation device according to claim 1, wherein
the irradiation opening is offset from a center point of the lower face so as to face the light source.

12. The light irradiation device according to claim 1, wherein
the irradiation opening is positioned to include a center point of the lower face so as to face the light source.

* * * * *